United States Patent
Torimi et al.

(10) Patent No.: US 9,644,894 B2
(45) Date of Patent: May 9, 2017

(54) SEMICONDUCTOR DEVICE MANUFACTURING APPARATUS

(71) Applicant: TOYO TANSO CO., LTD., Osaka-shi, Osaka (JP)

(72) Inventors: Satoshi Torimi, Kanonji (JP); Norihito Yabuki, Kanonji (JP); Satoru Nogami, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 189 days.

(21) Appl. No.: 14/468,524

(22) Filed: Aug. 26, 2014

(65) Prior Publication Data

US 2015/0249025 A1    Sep. 3, 2015

(30) Foreign Application Priority Data

Feb. 28, 2014  (JP) ................. 2014-038715

(51) Int. Cl.
| | |
|---|---|
| H01L 21/02 | (2006.01) |
| F27D 11/00 | (2006.01) |
| H01L 21/67 | (2006.01) |
| F27D 7/06 | (2006.01) |
| H01L 21/673 | (2006.01) |

(Continued)

(52) U.S. Cl.
CPC .......... *F27D 11/00* (2013.01); *F27B 17/0025* (2013.01); *F27D 5/0037* (2013.01); *F27D 7/06* (2013.01); *F27D 11/02* (2013.01); *H01L 21/67069* (2013.01); *H01L 21/67109* (2013.01); *H01L 21/67346* (2013.01); *H01L 21/67386* (2013.01); *F27D 2005/0081* (2013.01); *F27D 2007/063* (2013.01)

(58) Field of Classification Search
USPC .......................................... 432/247, 249, 253
See application file for complete search history.

(56) References Cited

U.S. PATENT DOCUMENTS 6,399,922 B2 *  6/2002  Okase ..................... C23C 16/56
                                                         118/724
6,758,669 B2 *  7/2004  Webster ............ H01L 21/67109
                                                         219/444.1

(Continued)

FOREIGN PATENT DOCUMENTS

| JP | 05203369 A | * | 8/1993 |
| JP | 2003246700 A | * | 9/2003 |
| JP | 2008-16691 A | | 1/2008 |

*Primary Examiner* — Gregory A Wilson
(74) *Attorney, Agent, or Firm* — Westerman, Hattori, Daniels & Adrian, LLP

(57) ABSTRACT

Provided is a heat treatment container having a small size and capable of efficiently performing a heat treatment on a SiC substrate. A heat treatment container is a container for a heat treatment on a SiC substrate 40 under Si vapor pressure. The SiC substrate 40 is made of, at least in a surface thereof, single crystal SiC. The heat treatment container includes a container part 30 and a substrate holder 50. The container part 30 includes an internal space 33 in which Si vapor pressure is caused. The internal space 33 is partially open. The substrate holder 50 is able to support the SiC substrate 40. When the substrate holder 50 supports the SiC substrate 40, an open portion of the container part 30 is covered so that the internal space 33 is hermetically sealed.

9 Claims, 11 Drawing Sheets

(51) Int. Cl.
*F27B 17/00* (2006.01)
*F27D 5/00* (2006.01)
*F27D 11/02* (2006.01)

(56) References Cited

U.S. PATENT DOCUMENTS

| | | | | |
|---|---|---|---|---|
| 6,936,102 | B1* | 8/2005 | Otsuki | C23C 16/325 |
| | | | | 117/101 |
| 7,927,096 | B2* | 4/2011 | Fukumoto | B25B 11/005 |
| | | | | 219/444.1 |
| 8,608,885 | B2* | 12/2013 | Goto | F27D 5/0037 |
| | | | | 156/85 |
| 8,986,466 | B2* | 3/2015 | Abe | C23C 8/64 |
| | | | | 148/223 |
| 2002/0177094 | A1* | 11/2002 | Shirakawa | H01L 21/67109 |
| | | | | 432/4 |
| 2005/0079690 | A1* | 4/2005 | Suka | C23C 16/4586 |
| | | | | 438/481 |
| 2006/0249073 | A1* | 11/2006 | Asaoka | C30B 19/00 |
| | | | | 117/84 |
| 2008/0072817 | A1* | 3/2008 | Zwieback | C30B 23/00 |
| | | | | 117/84 |
| 2013/0247816 | A1* | 9/2013 | Suzuki | H01L 21/02529 |
| | | | | 117/86 |
| 2014/0227548 | A1* | 8/2014 | Myrick | C06B 45/30 |
| | | | | 428/570 |
| 2014/0319539 | A1* | 10/2014 | Kaneko | C30B 19/04 |
| | | | | 257/77 |

* cited by examiner

| AVE($\mu$) | MAX | MIN | $3\sigma$ | $\sigma/\mu$ |
|---|---|---|---|---|
| 12060.6 | 13130.0 | 11240.0 | 1641.7 | 4.54% |

(UNIT: ×10¹⁰atoms/cm²)

| QUANTITATIVE ELEMENT | BEFORE HEAT TREATMENT | | AFTER HEAT TREATMENT | | LOWER LIMIT OF DETECTION |
|---|---|---|---|---|---|
| | Center | Edge | Center | Edge | |
| S | — | — | — | — | 210 |
| Cl | — | — | — | — | 130 |
| K | — | — | — | — | 54 |
| Ca | — | — | — | — | 40 |
| Ti | — | — | — | — | 22 |
| Cr | — | — | — | — | 14 |
| Mn | — | — | — | — | 12 |
| Fe | 19.92 | 39.95 | — | — | 8.3 |
| Co | — | — | — | — | 6.2 |
| Ni | — | — | — | — | 5.4 |
| Cu | — | — | — | — | 4.5 |
| Zn | — | — | — | — | 3.5 |
| Br | — | 2.17 | — | — | 1.6 |
| Sb | — | — | — | — | 23 |
| Ta | — | — | — | — | 2.4 |
| W | — | — | — | — | 2.1 |

SEMICONDUCTOR DEVICE MANUFACTURING APPARATUS

BACKGROUND OF THE INVENTION

1. Field of the Invention

The present invention relates mainly to a heat treatment container in which a SiC substrate is heated under Si vapor pressure for etching.

2. Description of the Related Art

SiC, which is superior to Si or the like in, for example, heat resistance and electrical characteristics, has attracted attention as a new semiconductor material.

Japanese Patent Application Laid-Open No. 2008-16691 discloses a surface treatment method for planarizing a surface of a SiC substrate. In the surface treatment method, a SiC substrate is heat-treated while being stored in a storage container (heat treatment container). The storage container includes an upper container and a lower container that are fittable to each other. The storage container, when the upper container and the lower container are fitted to each other, forms a hermetically sealed space. A heat treatment is performed with the upper container and the lower container fitted to each other and with Si pellets placed in the storage container. Performing such a heat treatment results in etching the SiC substrate arranged within the storage container, to obtain the SiC substrate that is planar at the molecular level.

SUMMARY OF THE INVENTION

Performing the heat treatment by using the above-described storage container, however, requires that the upper container be fitted into the lower container after a SiC substrate is arranged in the lower container. This fitting process is needed for each SiC substrate. As a result, the heat treatment on a SiC substrate cannot be efficiently performed, which leads to reduction in the efficiency of semiconductor device manufacture.

In a case where a SiC substrate is arranged within the storage container, it is necessary that the lower container is provided with a holder. This leads to an increase in the vertical size of the storage container.

The present invention has been made in view of the circumstances described above, and a primary object of the present invention is to provide a heat treatment container having a small size and capable of efficiently performing a heat treatment on a SiC substrate.

Problems to be solved by the present invention are as described above, and next, means for solving the problems and effects thereof will be described.

In a first aspect of the present invention, a heat treatment container for a heat treatment on a SiC substrate under Si vapor pressure is provided. The SiC substrate is made of, at least in a surface thereof, single crystal SiC. The heat treatment container has the following configuration. The heat treatment container includes a container part and a substrate holder. The container part includes an internal space in which Si vapor pressure is caused. The internal space is partially open. The substrate holder is able to support the SiC substrate. When the substrate holder supports the SiC substrate, an open portion of the container part is covered so that the internal space is hermetically sealed.

Accordingly, a hermetically sealed space is achieved only by supporting the SiC substrate on the substrate holder. This configuration, as compared with a configuration having a lid portion separately provided, simplifies the steps included in the heat treatment. This can consequently improve the efficiency of semiconductor device manufacture.

Preferably, the heat treatment container is configured as follows. The container part is configured such that the upper side of the internal space is open. The upper side of the internal space is covered by the substrate holder supporting the SiC substrate.

Accordingly, the heat treatment is performed on a lower surface of the SiC substrate. This can avoid a situation in which fine impurities drop onto the SiC substrate. Therefore, a SiC substrate having a high quality can be manufactured.

In the heat treatment container, it is preferable that the heat treatment container includes, on an upper surface thereof, a container holder for supporting a lower surface of another heat treatment container.

This enables heat treatment containers to be stacked. Performing the heat treatment collectively on a stack of heat treatment containers achieves an efficient heat treatment on the SiC substrates.

Preferably, the heat treatment container is configured as follows. The substrate holder has a through hole, and the SiC substrate is supported on an edge portion arranged lateral to the through hole. The container part includes a first step and a second step that is provided above the first step. The first step supports an outer edge of the substrate holder, and makes the SiC substrate face the internal space, the SiC substrate exposed to the internal space through the through hole. The second step supports a lower surface of another heat treatment container, the second step corresponding to the container holder.

Since the substrate holder supports an edge of the SiC substrate, the heat treatment can be performed on a portion of the SiC substrate except the edge. Accordingly, effective use of the surface of the SiC substrate can be made to manufacture a semiconductor (semiconductor device).

In the heat treatment container, it is preferable that at least the container part includes a tantalum metal, a tantalum carbide layer arranged at the internal space side of the tantalum metal, and a tantalum silicide layer arranged at the further internal space side of the tantalum carbide layer.

The conventional configuration in which Si is adhered to an inner surface of a storage container for the supply of Si may cause Si to melt and fall, which causes adverse effects on a SiC substrate. In this respect, the above-described configuration in which the tantalum silicide layer is provided for the supply of Si to the internal space can prevent such adverse effects.

In the heat treatment container, it is preferable that the tantalum silicide layer is provided over an entire wall surface that defines the internal space of the container part.

This allows Si pressure in the internal space to be uniform, and therefore the heat treatment on the SiC substrate can be performed uniformly.

In the heat treatment container, it is preferable that the container part and the substrate holder are separatable from each other, and the substrate holder is replaceable.

Accordingly, replacing the substrate holder makes it possible to perform the heat treatment on SiC substrates having various shapes and sizes.

In a second aspect of the present invention, a heat treatment container assembly including a plurality of the heat treatment containers coupled to one another is provided.

This enables the heat treatment to be performed collectively on a plurality of SiC substrates. Therefore, the SiC substrates can be treated efficiently.

In a third aspect of the present invention, an apparatus for manufacturing a semiconductor device is provided. The apparatus includes the heat treatment container.

Accordingly, an apparatus for manufacturing a semiconductor device, that can exert the above-described effects, is achieved.

DETAILED DESCRIPTION OF THE PREFERRED EMBODIMENTS

Next, an embodiment of the present invention will be described with reference to the drawings.

Figure 1:
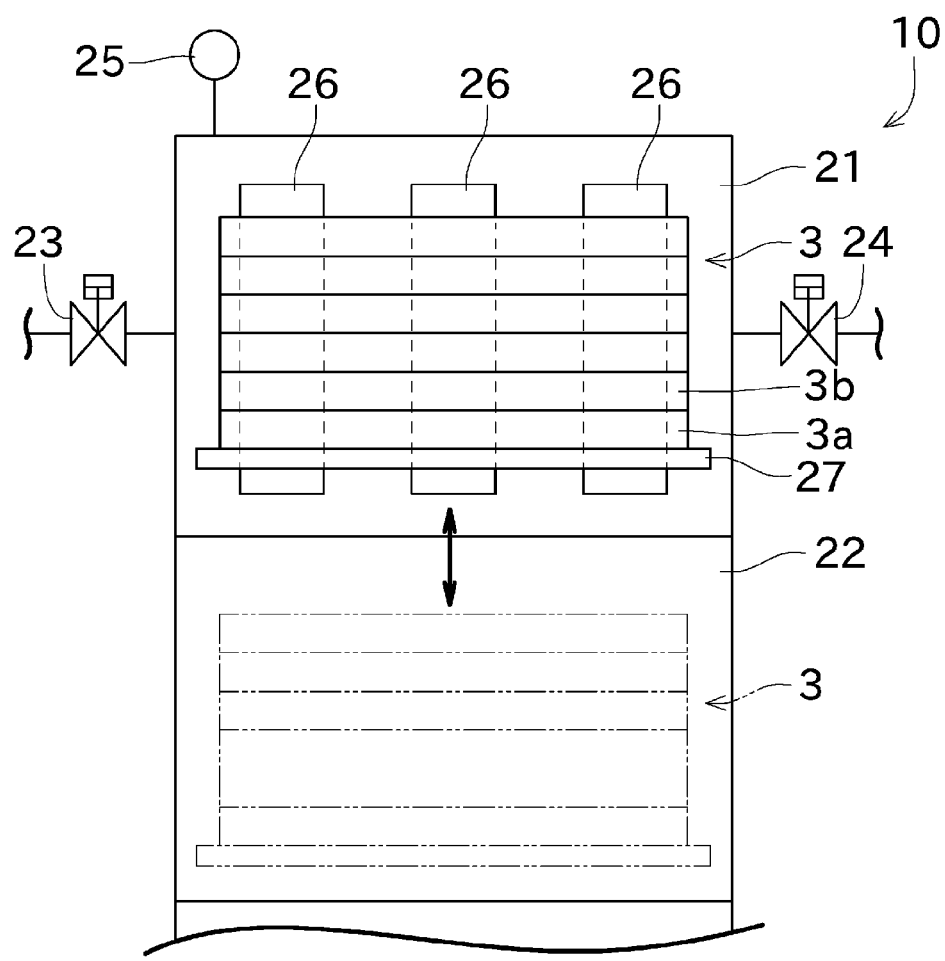
FIG. 1 is a diagram illustrating outline of a high temperature vacuum furnace including heat treatment containers according to the present invention.

Firstly, referring to FIG. 1, a high temperature vacuum furnace (apparatus for manufacturing a semiconductor device) 10 used for a heat treatment of this embodiment will be described. FIG. 1 is a diagram illustrating outline of a high temperature vacuum furnace used for a surface treatment method of the present invention.

As shown in FIG. 1, the high temperature vacuum furnace 10 includes a main heating chamber 21 and a preheating chamber 22. The main heating chamber 21 is configured to heat a SiC substrate made of, at least in its surface, single crystal SiC, up to a temperature of 1000° C. or more and 2300° C. or less. The preheating chamber 22 is a space for preheating a SiC substrate prior to heating of the SiC substrate in the main heating chamber 21.

A vacuum-forming valve 23, an inert gas injection valve 24, and a vacuum gauge 25 are connected to the main heating chamber 21. The vacuum-forming valve 23 is configured to adjust the degree of vacuum of the main heating chamber 21. The inert gas injection valve 24 is configured to adjust pressure of an inert gas (for example, Ar gas) contained in the main heating chamber 21. The vacuum gauge 25 is configured to measure the degree of vacuum of the interior of the main heating chamber 21.

Heaters 26 are provided in the main heating chamber 21. A heat reflection metal plate (not shown) is secured to a side wall and a ceiling of the main heating chamber 21. The heat reflection metal plate is configured to reflect heat of the heaters 26 toward a central region of the main heating chamber 21. This provides strong and uniform heating of a SiC substrate 40, to cause a temperature rise up to 1000° C. or more and 2300° C. or less. Examples of the heater 26 include resistive heaters and high-frequency induction heaters.

The SiC substrates 40 are stored in a heat treatment container assembly 3. The heat treatment container assembly 3 includes heat treatment containers 3a to 3f. Each of the heat treatment containers 3a to 3f is configured to support a single SiC substrate 40. The heat treatment container assembly 3 is placed on a work table 27. The work table 27 is movable at least from the preheating chamber 22 to the main heating chamber 21 by means of a driver and a transmission mechanism (not shown).

To perform a heat treatment on the SiC substrates 40, the heat treatment container assembly 3 is firstly placed in the preheating chamber 22 of the high temperature vacuum furnace 10 as indicated by the dot-dash lines in FIG. 1, and preheated at an appropriate temperature (for example, about 800° C.). Then, the heat treatment container assembly 3 is moved to the main heating chamber 21 whose temperature has been elevated to a set temperature (for example, about 1800° C.) in advance. Then, the SiC substrate 40 is heated under an appropriate environment. The preheating may be omitted.

Figure 2:
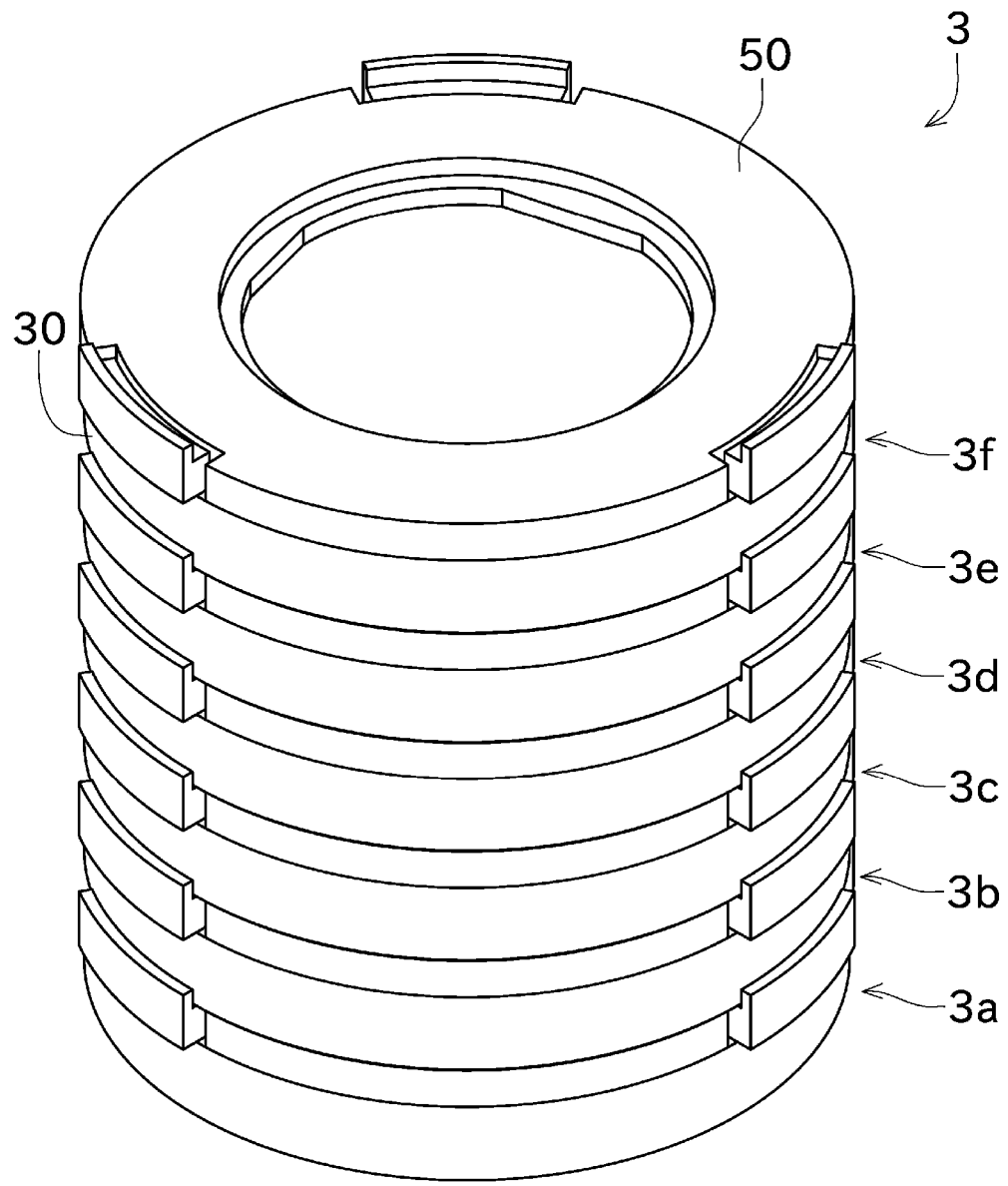
FIG. 2 is a perspective view showing a heat treatment container assembly.
Figure 3:
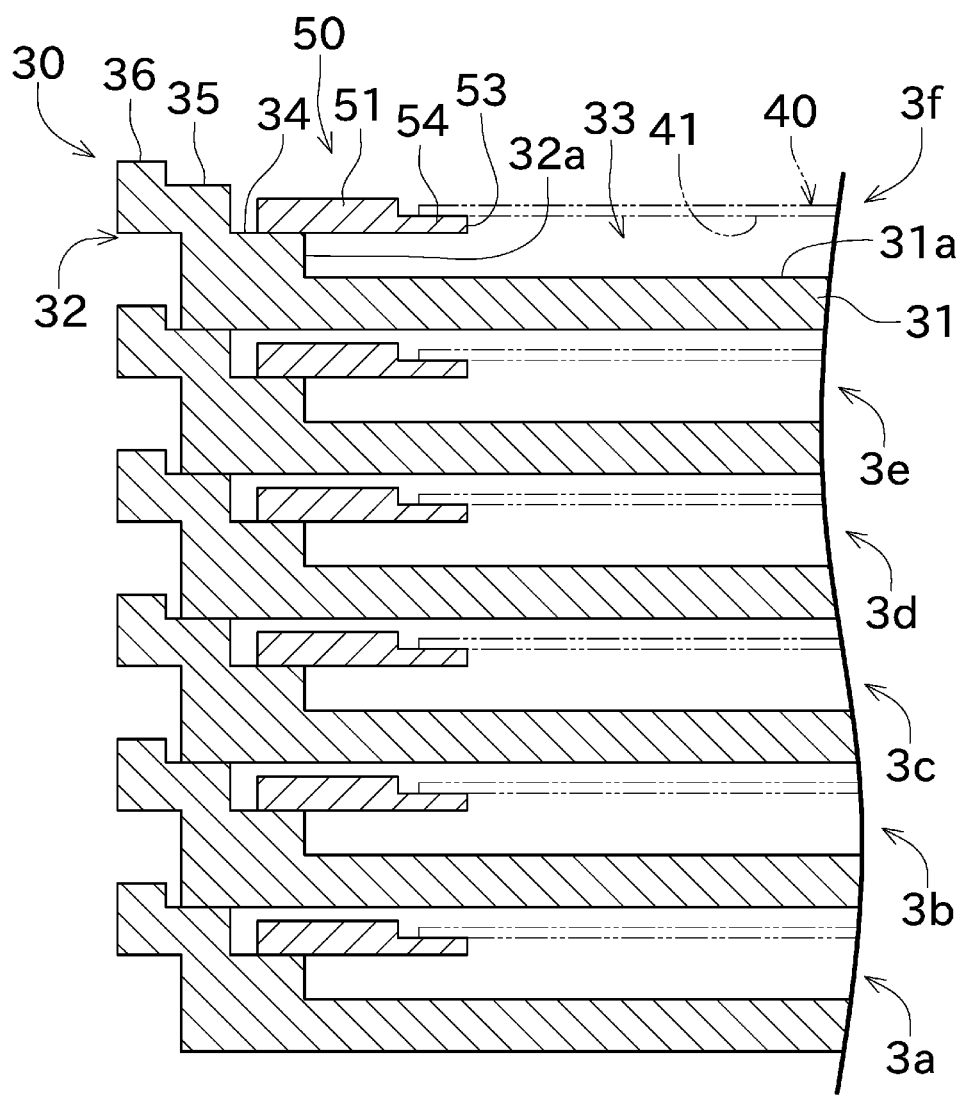
FIG. 3 is a diagram showing an end face of the heat treatment container assembly.

Next, the heat treatment container assembly 3 will be described. As shown in FIGS. 2 and 3, the heat treatment container assembly 3 includes the heat treatment containers 3a to 3f stacked in the vertical direction. Since all of the heat treatment containers 3a to 3f have the same shape, the heat treatment container 3a will be described as a representative.

Figure 4:
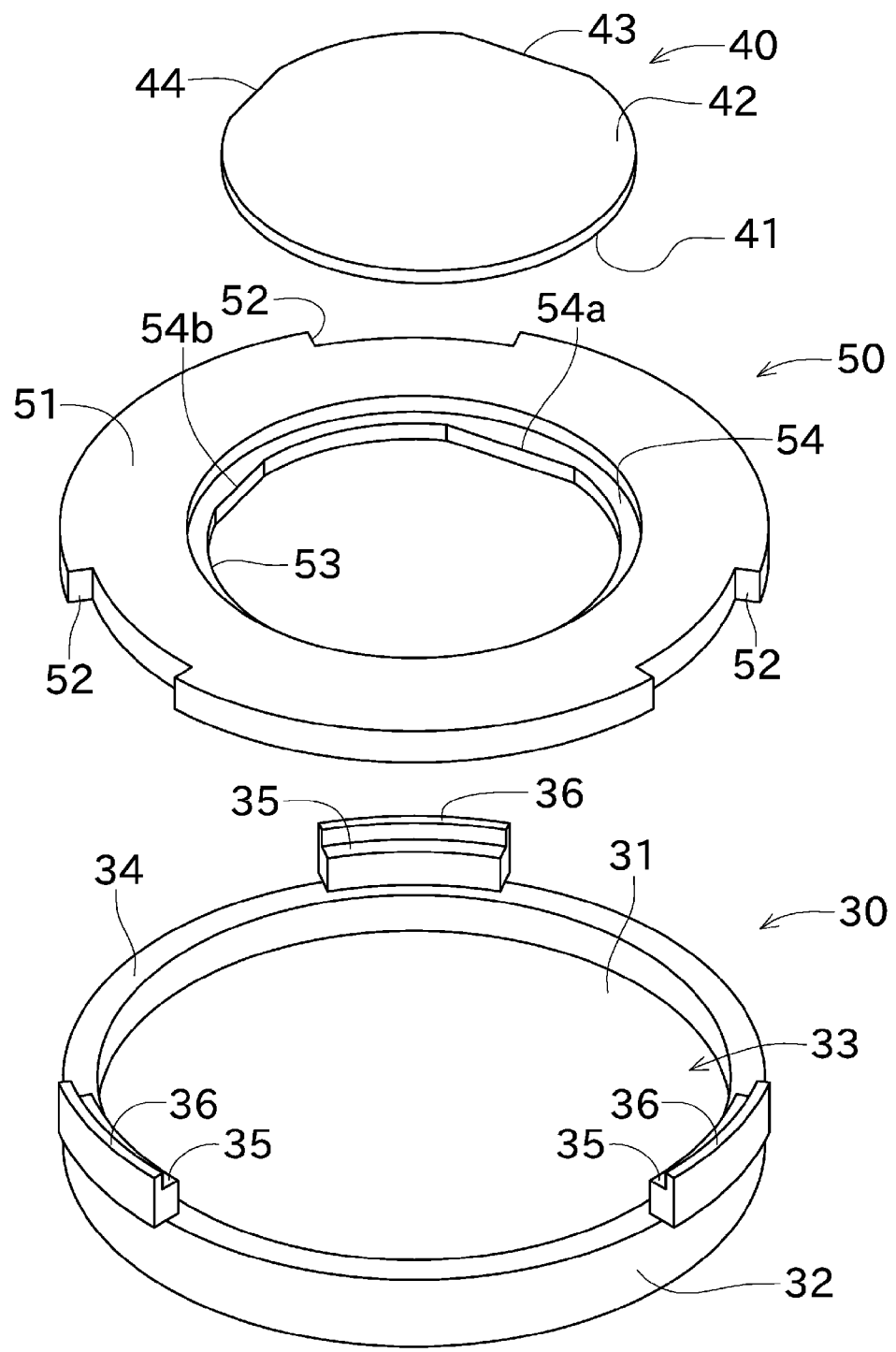
FIG. 4 is an exploded perspective view of the heat treatment container.
Figure 5A:
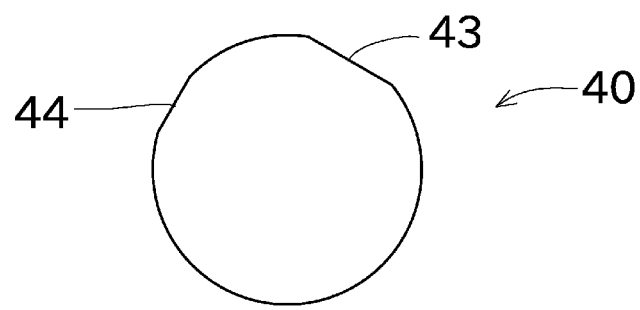
FIGS. 5A to 5C are plan views showing a SiC substrate, a substrate holder, and a container part.
Figure 5B:
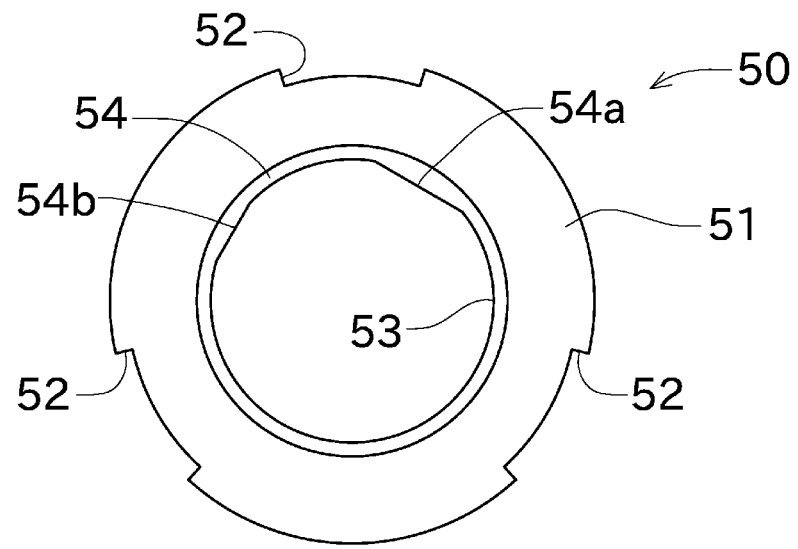
Figure 5C:
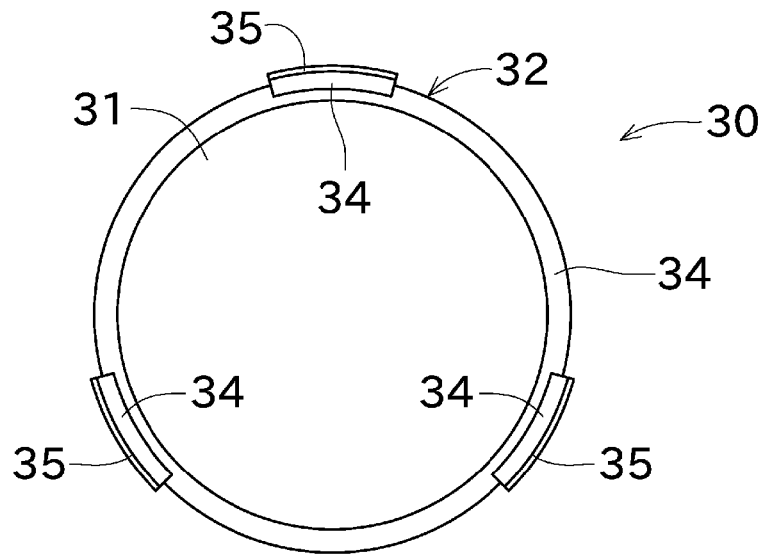

As shown in FIG. 4, the heat treatment container 3a is a container for supporting the SiC substrate 40 and heating the SiC substrate 40 under Si vapor pressure. The heat treatment container 3a includes a container part 30 and a substrate holder 50.

As shown in FIG. 4, etc., the container part 30 is a cylindrical container with a bottom, and its axial length is short. The container part 30 includes a bottom surface portion 31 and a side surface portion 32. As shown in FIG. 3, a bottom-surface inner wall surface 31a provided at the inner side of the bottom surface portion 31 and a side-surface inner wall surface 32a provided at the inner side of the side surface portion 32 define an internal space 33. The internal space 33 is a space whose upper side is open.

The side surface portion 32 is provided with a first step 34, second steps 35, and third steps 36.

The first step 34 is provided throughout the circumference of the container part 30. The first step 34 supports an outer edge portion of the substrate holder 50.

The second steps 35 are formed at positions higher than the first step 34. The second steps 35 are formed at three positions at equal intervals. In other words, the second steps 35 are formed not throughout the circumference but only partially in the circumference. When the heat treatment container 3b is staked on the heat treatment container 3a, the second steps 35 support the container part 30 (more specifically, a bottom surface of the side surface portion 32) of the heat treatment container 3b.

The third steps 36 are formed at positions higher than the first step 34 and the second steps 35. The third steps 36, each of which is provided at the upper side of each of the second steps 35, are formed at three positions at equal intervals. The third steps 36 restrict the position of the heat treatment container 3b stacked thereon and prevent horizontal displacement of the heat treatment container 3b relative to the heat treatment container 3a.

As shown in FIG. 4, the SiC substrate 40 has a substantially disk-like shape. The SiC substrate 40 includes a surface 41 to be treated, and a back surface 42 opposite thereto. In this embodiment, the SiC substrate 40 is arranged with the surface 41 to be treated facing downward.

The SiC substrate 40 also includes a first orientation flat 43 and a second orientation flat 44. They are portions (linear portions) obtained as a result of cutting out a circular plate for the purpose of indicating crystal axes orientations. They also serve to prevent confusing of the front and back in handling of the SiC substrate 40.

The substrate holder 50 is a member for supporting the SiC substrate 40 and making the surface 41 to be treated face (exposed to) the internal space. The substrate holder 50 includes a base portion 51 that is a substantially disk-shaped member.

The base portion 51 has, in its outer edge, notches 52. The notches 52 are formed at three positions at equal intervals. The substrate holder 50 is mounted to the container part 30 with the second steps 35 received in the notches 52 (FIG. 2). This configuration is able to restrict horizontal displacement and rotation of the substrate holder 50 relative to the container part 30 without the need to secure the substrate holder 50 with bolts or the like.

A through hole 53 and an edge portion (countersink) 54 are formed in the center of the base portion 51. The through hole 53 is provided for making the SiC substrate 40 face the internal space. The edge portion 54, which is formed immediately lateral to the through hole 53, is a step having a smaller height than that of an upper surface of the base portion 51. The edge portion 54 has a first linear portion 54a and a second linear portion 54b corresponding to the above-mentioned first orientation flat 43 and second orientation flat 44, respectively. The first linear portion 54a and the second linear portion 54b serve as marks for subjecting a desired surface to the treatment without causing confusion of the front and back of the SiC substrate 40.

The edge portion 54 is configured to be in contact with an outer edge of the SiC substrate 40 to thereby support the SiC substrate 40. Since the edge portion 54 is provided at a position lower than the base portion 51, horizontal displacement of the SiC substrate 40 relative to the substrate holder 50 can be restricted.

Preferably, the shape (a rectangular shape or circular shape) and the size of the edge portion 54 correspond to those of the SiC substrate 40. To be more specific, the size of the edge portion 54 needs to be slightly larger than the size of the SiC substrate 40, for easy mounting and dismounting of the SiC substrate 40. As described above, the substrate holder 50 and the container part 30 can be easily separated without using bolts or the like. Accordingly, alternatively adopting other substrate holders 50 having through holes 53 with different shapes and sizes makes the heat treatment container 3a adapted for various types of SiC substrates 40.

The SiC substrate 40 is placed on the substrate holder 50, and then the substrate holder 50 is placed on the container part 30, thereby making the surface 41 to be treated of the SiC substrate 40 face the internal space 33 through the through hole 53 (FIG. 2). Since the upper open side of the internal space 33 is covered by the substrate holder 50 and the SiC substrate 40, the internal space 33 is a hermetically sealed space. This can eliminate the labor of fitting the upper container to the lower container, which has been required in the conventional techniques. In the present application, "hermetically sealed space" does not require the degree of sealing that completely block movement of a gas. It suffices that a gas is sealed to a certain degree.

Figure 6:
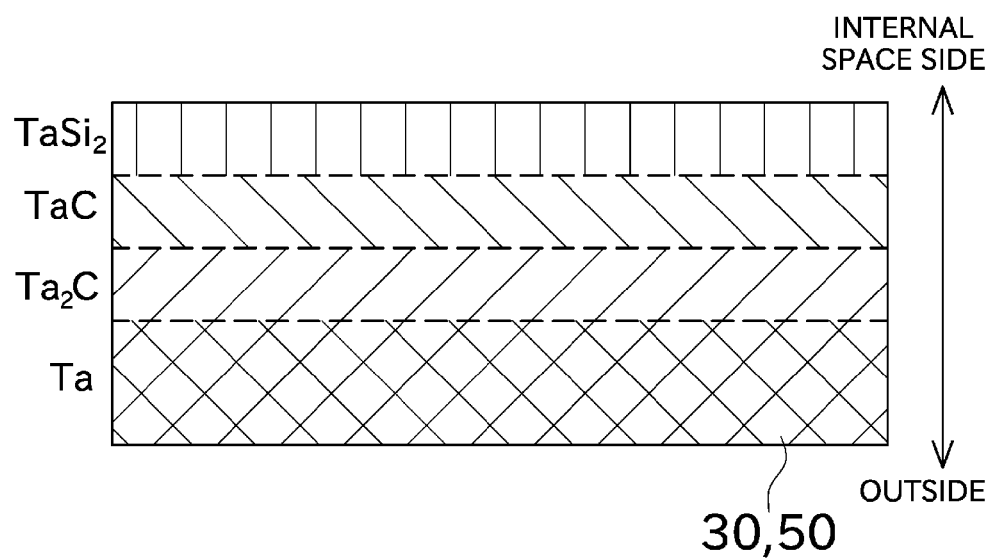
FIG. 6 is a diagram schematically showing a composition of a wall surface of the heat treatment container.

Next, a composition of the container part 30 and the substrate holder 50 will be described with reference to FIG. 6. FIG. 6 is a diagram schematically showing a composition of a wall surface of the heat treatment container.

The container part 30 and the substrate holder 50 have, at least in their portions constituting a wall surface that defines the internal space 33, the composition shown in FIG. 6. More specifically, a tantalum layer (Ta), tantalum carbide layers (TaC and $Ta_2C$), and a tantalum silicide layer ($TaSi_2$) are provided in this order from the outside toward the internal space 33 side.

A crucible including a tantalum layer and a tantalum carbide layer has been conventionally known. In this embodiment, a tantalum silicide layer is additionally formed. The tantalum silicide layer is for applying Si vapor pressure in the internal space 33, and corresponds to Si pellets of the Japanese Patent Application Laid-Open No. 2008-16691.

A method for forming a tantalum silicide layer will be briefly described below. A tantalum silicide layer is formed by bringing molten Si into contact with an inner wall surface of a crucible and heating it at about 1800° C. or more and 2000° C. or less. Thereby, a tantalum silicide layer made of $TaSi_2$ is formed. In this embodiment, a tantalum silicide layer having a thickness of about 30 μm to 50 μm is formed. Depending on the volume of the internal space, etc., a tantalum silicide layer having a thickness of, for example, 1 μm to 300 μm may be formed.

A tantalum silicide layer can be formed through the above-described process. Although this embodiment adopts $TaSi_2$ as tantalum silicide, tantalum silicide represented by another formula is also adoptable. A plurality of types of tantalum silicide laminated one on another is also acceptable.

In this embodiment, the tantalum silicide layer is provided over an entire wall surface (a side wall, a bottom surface, and an upper surface except the SiC substrate 40) that defines the internal space 33. This allows Si pressure in the internal space 33 to be uniform, and therefore the heat treatment on the SiC substrate 40 can be performed uniformly.

Next, referring to FIGS. 7A to 7E, a description will be given of a process of manufacturing a semiconductor device from the SiC substrate 40 by using the high temperature vacuum furnace 10 and the heat treatment container assembly 3 described above. FIGS. 7A to 7E are diagrams each schematically showing the state of a substrate in each step.

Figure 7A:
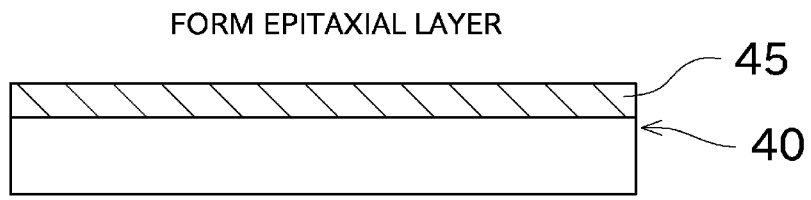
FIGS. 7A to 7E are diagrams each schematically showing the state of a SiC substrate in each step.

Firstly, as shown in FIG. 7A, an epitaxial layer 45 is formed on the SiC substrate 40. Any method is adoptable for forming the epitaxial layer. For example, vapor phase epitaxy or metastable solvent epitaxy, which are known methods, are adoptable. In a case where the SiC substrate 40 is an off-substrate, a CVD process is adoptable to form an epitaxial layer by using step flow control.

Figure 7B:
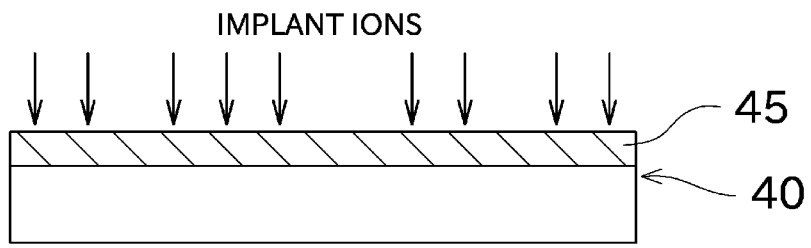

Then, as shown in FIG. 7B, ion implantation into the SiC substrate 40 having the epitaxial layer 45 formed thereon is performed. The ion implantation is implemented by using an ion doping apparatus having a function for ion-irradiating an object. The ion doping apparatus implants ions into the entire surface of the epitaxial layer 45 or into a selective part of the surface of the epitaxial layer 45. A desired region of a semiconductor device is provided based on an ion-implanted region 46 in which the ions have been implanted.

Figure 7C:
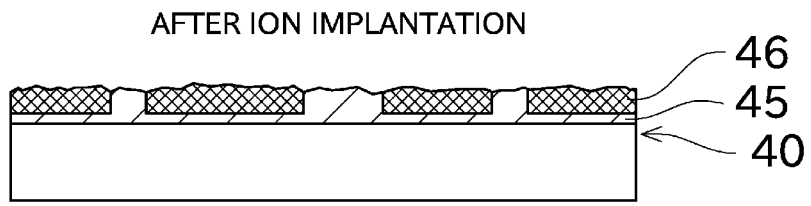

As a result of the ion implantation, as shown in FIG. 7C, the surface of the epitaxial layer 45 containing the ion-implanted regions 46 is roughened (the surface of the SiC substrate 40 is damaged, so that the flatness is deteriorated).

Figure 7D:
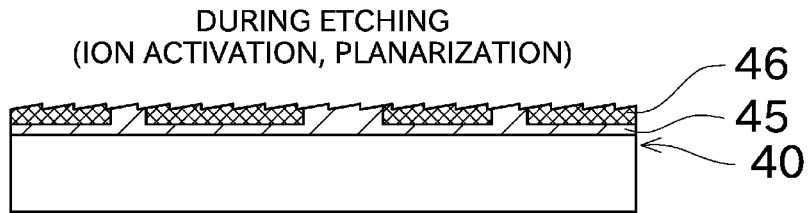
Figure 7E:
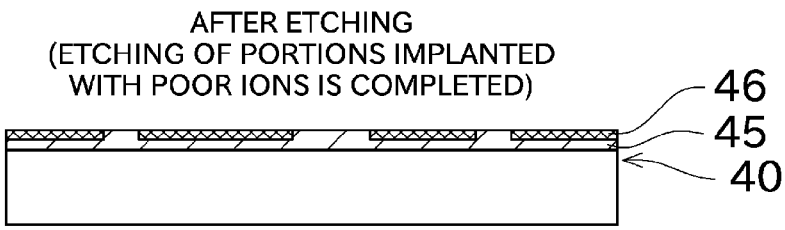

Then, activation of the implanted ions and etching of the ion-implanted regions 46 and the like are performed (see FIG. 7D). In this embodiment, these two processes can be performed in a single step. More specifically, a heat treatment (annealing) is performed under Si vapor pressure and at a temperature of 1500° C. or more and 2200° C. or less and desirably 1600° C. or more and 2000° C. or less. This can activate the implanted ions. Additionally, the surface of the SiC substrate 40 is etched so that the roughened portions of the ion-implanted regions 46 are planarized (see FIG. 7E).

The above-described process enables the surface of the SiC substrate 40 to obtain a sufficient flatness and electrical activity. The surface of the SiC substrate 40 can be used to manufacture a semiconductor device.

Next, a description will be given of an experiment that was conducted for the purpose of evaluating the heat treatment performed by the heat treatment container assembly 3 of this embodiment. In the experiment described below, a heat treatment container assembly 3 including a stack of three heat treatment containers was adopted, and an object to be treated was a 4-inch SiC substrate 40 having an off angle of 4°. Firstly, an epitaxial growth of about 10 μm was caused on the SiC substrate 40. Then, Al ions at a dosage of 5.6E+14/cm$^2$ were implanted into the surface of the SiC substrate at a distance of 500 nm therefrom. Then, the heat treatment was performed.

Figure 8A:
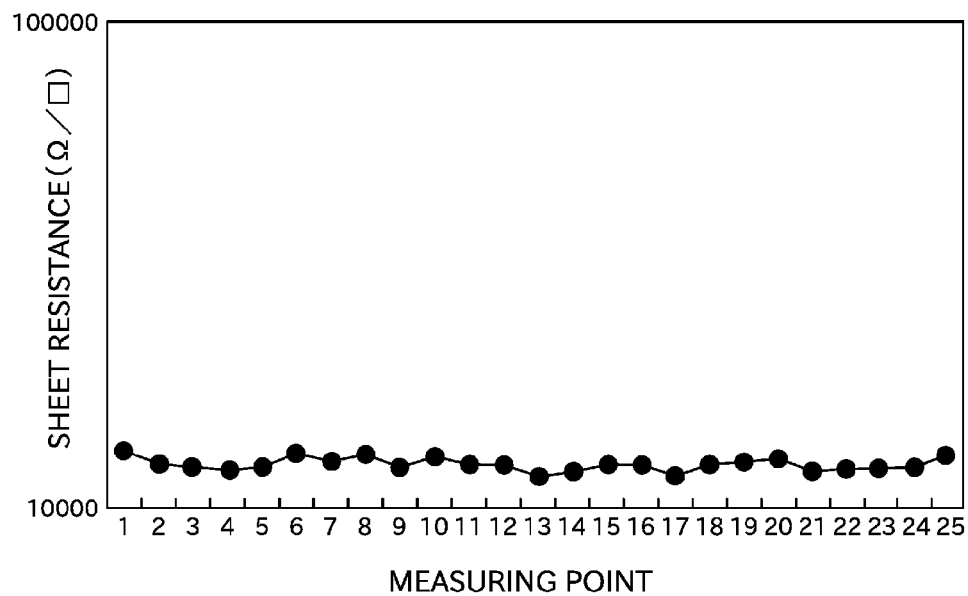
FIGS. 8A to 8C are diagrams showing measurement results of the sheet resistance depending on positions in a SiC substrate after a heat treatment.
Figure 8B:
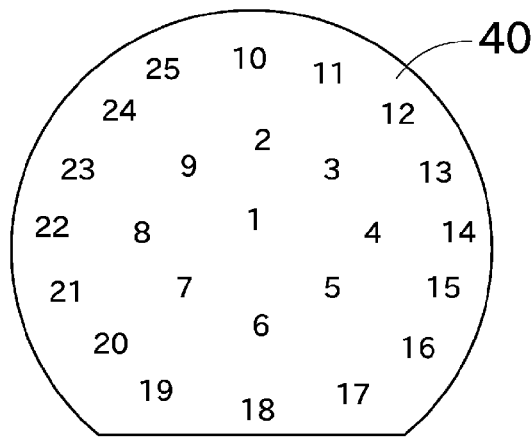
Figures 8C, 9:
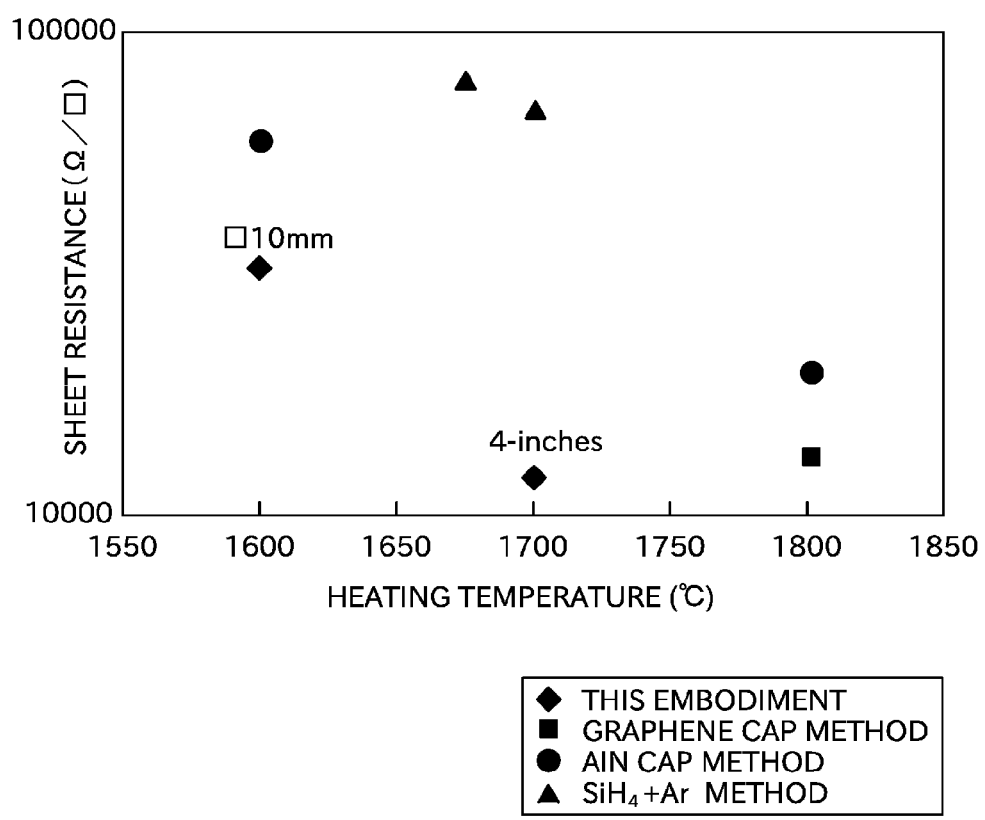
FIG. 9 is a diagram for comparison between the sheet resistance of a SiC substrate subjected to the heat treatment according to this embodiment and the sheet resistances of SiC substrates subjected to conventional heat treatments.

FIGS. 8A to 8C are diagrams showing measurement results of the sheet resistance depending on positions in the SiC substrate after the heat treatment. In the step of implanting ions, the ions were implanted into the entire SiC substrate 40. In the graph of FIG. 8A, the horizontal axis represents measuring points, each of which corresponds to each of the numbers shown in FIG. 8B. In FIG. 8A, the vertical axis represents the sheet resistance. Based on the results obtained, an average value, a maximum value, a minimum value, 3σ, and a coefficient of variation (σ/μ) were calculated. The coefficient of variation was 4.54%. This, in consideration of the fact that a variation in ion implantation is about 5%, shows that the treatment was performed uniformly on the surface.

FIG. 9 is a diagram for comparison between the sheet resistance of a SiC substrate subjected to the heat treatment according to this embodiment and the sheet resistances of SiC substrates subjected to conventional heat treatments. As shown in the graph of FIG. 9, in both 1600° C. and 1700° C., the SiC substrate 40 obtained by the method of this embodiment exhibits a lower sheet resistance than the sheet resistances of the SiC substrates obtained by any other methods. This shows that the SiC substrate 40 having a high quality was obtained. Particularly in 1700° C., the SiC substrate 40 exhibits a lower sheet resistance than the sheet resistances of the SiC substrates obtained by any other methods. This shows that a SiC substrate having a very high quality was obtained.

Figures 10A, 10B:
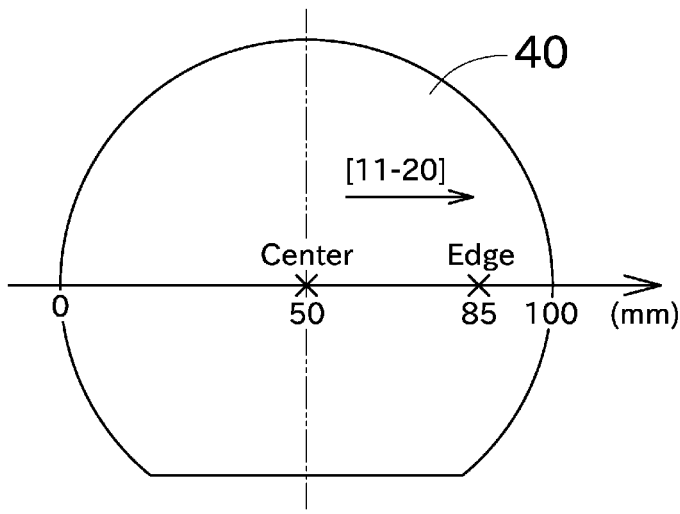
FIGS. 10A and 10B are diagrams showing the purity in a surface of the SiC substrate before and after the heat treatment.

FIGS. 10A and 10B are diagrams showing the purity in the surface of the SiC substrate before and after the heat treatment. FIG. 10A shows the positions of sampling points (Center and Edge) in the surface of the SiC substrate 40. FIG. 10B is a diagram showing the contents of other impurities before and after the heat treatment. As shown in FIG. 10B, substantially no impurities were detected, and it can be found that impurities detected before the heat treatment were removed by the etching caused in the heat treatment.

Figure 11A:
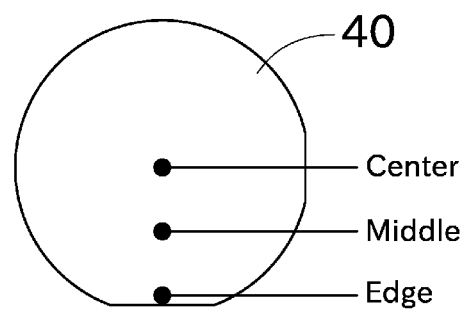
FIGS. 11A and 11B are diagrams showing measurement results of the etching rate depending on positions in a SiC substrate.
Figure 11B:
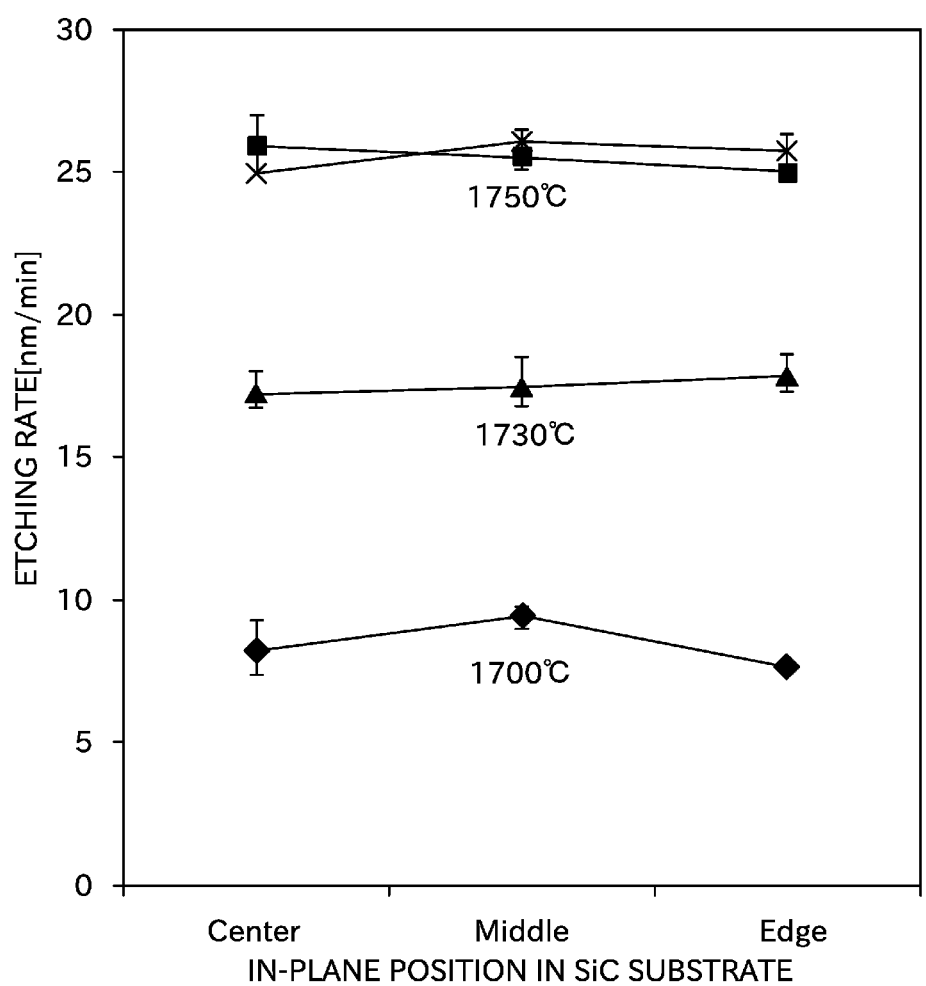

FIGS. 11A and 11B are diagrams showing measurement results of the etching rate depending on positions in the SiC substrate. FIG. 11A shows the positions of sampling points in the surface of the SiC substrate 40. FIG. 11B shows the etching rate in the respective positions at each temperature. In any temperature, the etching rate has substantially a constant value. This reveals that the etching was performed uniformly irrespective of positions in the SiC substrate 40. Although a slight variation was observed, the cause thereof seems to be, for example, a temperature variation.

As thus far described, each of the heat treatment containers 3a to 3f of this embodiment includes the container part 30 and the substrate holder 50. The container part 30 includes the internal space 33 in which Si vapor pressure is caused. The internal space 33 is partially open. The substrate holder 50 is able to support the SiC substrate 40. When the substrate holder 50 supports the SiC substrate 40, an open portion of the container part 30 is covered so that the internal space 33 is hermetically sealed.

Accordingly, a hermetically sealed space is achieved only by supporting the SiC substrate 40 on the substrate holder 50. This configuration, as compared with a configuration having a lid portion separately provided, simplifies the steps included in the heat treatment. This can consequently improve the efficiency of semiconductor device manufacture. Additionally, unlike conventional, there is no need to provide a holder in the lower container. This can reduce the vertical size of the heat treatment container.

In each of the heat treatment containers 3a to 3f of this embodiment, the container part 30 is configured such that the upper side of the internal space 33 is open. The upper side of the internal space 33 is covered by the substrate holder 50 supporting the SiC substrate 40.

Accordingly, the heat treatment is performed on a lower surface of the SiC substrate 40. This can avoid a situation in which fine impurities drop onto the surface 41 to be treated. Therefore, the SiC substrate 40 having a high quality can be manufactured.

Each of the heat treatment containers 3a to 3f of this embodiment includes, on the upper surface thereof, the second steps (container holder) 35 that support the lower surface of another of the heat treatment containers 3a to 3f.

This enables heat treatment containers to be stacked. Performing the heat treatment collectively on a stack of heat treatment containers achieves an efficient heat treatment on the SiC substrates.

In the heat treatment containers 3a to 3f of this embodiment, it is preferable that at least the container part 30 includes a tantalum metal, a tantalum carbide layer arranged at the internal space 33 side of the tantalum metal, and a tantalum silicide layer arranged at the further internal space 33 side of the tantalum carbide layer.

The conventional configuration in which Si is adhered to an inner surface of a storage container for the supply of Si may cause Si to melt and fall, which causes adverse effects on a SiC substrate. In this respect, the above-described configuration in which the tantalum silicide layer is provided for the supply of Si to the internal space 33 can prevent such adverse effects.

While a preferred embodiment of the present invention has been described above, the above-described configuration can be modified, for example, as follows.

Although this embodiment illustrates the case where the heat treatment containers 3a to 3f are used for the etching after the ion implantation, the above-described control is applicable to a variety of steps that need uniform etching or the like.

For example, a process including forming a carbonized layer and a sacrificial growth layer and then etching the sacrificial growth layer is known as a method for planarizing a substrate (a substrate containing crystal defects and the like) before an epitaxial growth. The heat treatment containers 3a to 3f of this embodiment can be used for the etching of the sacrificial growth layer. This enables the sacrificial growth layer to be removed uniformly.

A method for forming a tantalum silicide layer is not limited to the method illustrated in the above-described embodiment. Any method is adoptable as long as the method is able to provide a heat treatment container having the above-described structure (composition).

The shapes of the heat treatment containers 3a to 3f may be any shapes, and may be changed as appropriate. For example, it may be acceptable that the container part 30 and the substrate holder 50 are integrally formed. This can simplify the shape of the heat treatment container 3a, though the substrate holder 50 cannot be replaced. Additionally, the internal space 33 may have a cylindrical shape, a cubic shape, or a rectangular parallelepiped shape.

In this embodiment, the container part 30 is placed on the substrate holder 50 so that the opening of the internal space 33 is covered by the SiC substrate 40 and the substrate holder 50. Alternatively, the opening of the internal space 33 may be covered substantially only by the SiC substrate 40.

Instead of a tantalum silicide layer formed on the wall surface of the internal space, solid Si pellets may be arranged. Alternatively, Si may be adhered to the wall surface.

The number of heat treatment containers in a stack included in the heat treatment container assembly 3 may be any number, and it can be changed in accordance with, for example, the number of SiC substrates 40 to be treated or the size of the high temperature vacuum furnace 10.

In this embodiment, the upper side of the internal space 33 is open, and therefore the lower surface of the SiC substrate 40 serves as the surface 41 to be treated. Instead, the lower side of the internal space 33 may be open. In such a case, the upper side of the SiC substrate 40 serves as the surface 41 to be treated. Alternatively, for example, the lateral side of the internal space may be open.

In another possible configuration, heat treatment containers whose bottom surfaces are not provided may be stacked so that internal spaces of the heat treatment containers are coupled to one another. In such a case, silicide serving as a Si supply source may be provided at the internal space 33 side of the side surface portion 32 or may be provided on the upper surface or lower surface of the substrate holder 50. Such a configuration causes Si vapor pressure in regions above and below the SiC substrate 40, which enables opposite surfaces of the SiC substrate 40 to be treated concurrently.

The environment in which the treatment was performed, the SiC substrate that was used, and the like, are merely illustrative examples, and the present invention is applicable to various environments and various SiC substrates.

What is claimed is:

1. A heat treatment container for a heat treatment on a SiC substrate under Si vapor pressure, the SiC substrate made of, at least in a surface thereof, single crystal SiC, the heat treatment container comprising:

a container part including an internal space in which Si vapor pressure is caused, the internal space being partially open; and a substrate holder that is able to support the SiC substrate, the substrate holder configured such that, when the substrate holder supports the SiC substrate, an open portion of the container part is covered so that the internal space is hermetically sealed, wherein the open portion of the internal space of the container part is covered by the SiC substrate, the SiC substrate is placed on the substrate holder, thereby making the surface to be treated of the SiC substrate face the hermetically sealed space, and the heat treatment container in which the SiC substrate is heated under the Si vapor pressure is for etching.

2. The heat treatment container according to claim 1, wherein
   the container part is configured such that the upper side of the internal space is open,
   the upper side of the internal space is covered by the substrate holder supporting the SiC substrate.

3. The heat treatment container according to claim 2, wherein
   the heat treatment container includes, on an upper surface thereof, a container holder for supporting a lower surface of another heat treatment container.

4. The heat treatment container according to claim 3, wherein
   the substrate holder has a through hole, and the SiC substrate is supported on an edge portion arranged lateral to the through hole,
   the container part includes a first step and a second step that is provided above the first step,
   the first step supports an outer edge of the substrate holder, and makes the SiC substrate face the internal space, the SiC substrate exposed to the internal space through the through hole,
   the second step supports a lower surface of another heat treatment container, the second step corresponding to the container holder.

5. The heat treatment container according to claim 1, wherein
   at least the container part includes a tantalum metal, a tantalum carbide layer arranged at the internal space side of the tantalum metal, and a tantalum silicide layer arranged at the further internal space side of the tantalum carbide layer.

6. The heat treatment container according to claim 5, wherein
   the tantalum silicide layer is provided over an entire wall surface that defines the internal space of the container part.

7. The heat treatment container according to claim 1, wherein
   the container part and the substrate holder are separatable from each other, and the substrate holder is replaceable.

8. A heat treatment container assembly including a plurality of the heat treatment containers according to claim 1 coupled to one another.

9. An apparatus for manufacturing a semiconductor device, the apparatus including the heat treatment container according to claim 1.

* * * * *